United States Patent [19]

Dingwall

[11] 4,242,738
[45] Dec. 30, 1980

[54] LOOK AHEAD HIGH SPEED CIRCUITRY

[75] Inventor: Andrew G. F. Dingwall, Bridgewater, N.J.

[73] Assignee: RCA Corporation, New York, N.Y.

[21] Appl. No.: 81,040

[22] Filed: Oct. 1, 1979

[51] Int. Cl.³ .................................................. G11C 11/40
[52] U.S. Cl. .................................... 365/189; 365/174; 365/181; 307/239
[58] Field of Search ............... 365/174, 181, 189, 203, 365/226, 230; 307/239, 246, 251, 255

[56] References Cited

U.S. PATENT DOCUMENTS

| 3,812,384 | 5/1974 | Skorup | 307/238 |
| 3,845,328 | 10/1974 | Hollingsworth | 307/251 |
| 3,906,255 | 9/1975 | Mensch, Jr. | 307/205 |

Primary Examiner—Terrell W. Fears
Attorney, Agent, or Firm—Samuel Cohen; Henry I. Schanzer

[57] ABSTRACT

A circuit having a first drive transistor for clamping the circuit output to a first point of operating potential in response to a first data input signal representing one binary value and a second drive transistor for clamping the circuit output to a second point of operating potential in response to a second data input signal representing the other binary value includes means for momentarily turning on the first and second drive transistors and presetting the output of the circuit to a voltage level intermediate the first and second points of operating potential in anticipation of the application of a data signal. The circuit may also include a first signal path, for applying the data and control signals to the first transistor, which propagates the first signals faster than the second signals and a second signal path, for applying the data and control signals to the second transistor, which propagates the second signals faster than the first signals.

13 Claims, 4 Drawing Figures

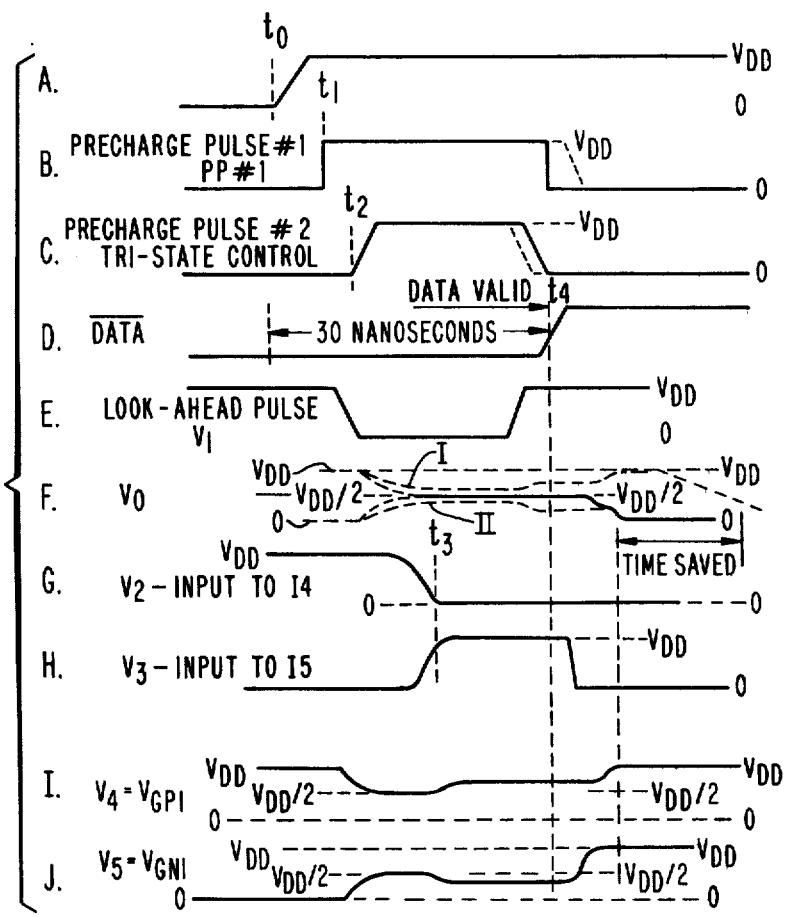
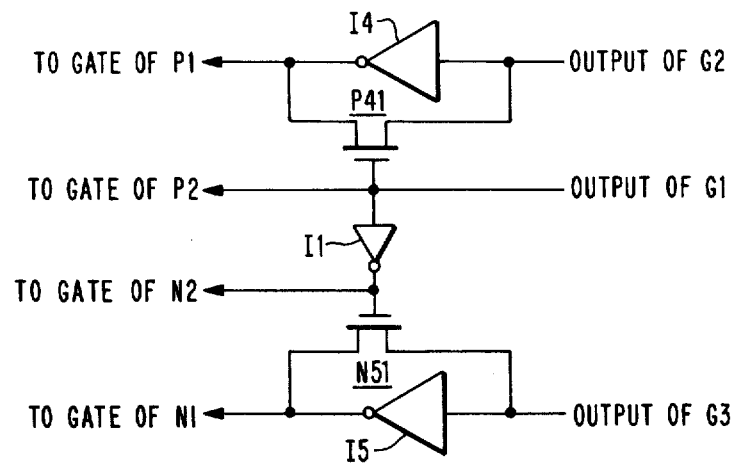
Fig. 4.

LOOK AHEAD HIGH SPEED CIRCUITRY

This invention relates to means for conditioning a circuit in anticipation of the application of a data signal for increasing the speed with which the data, when applied, is propagated through the circuit and established at the circuit output.

Many problems exist in the design of a high speed circuit, particularly where the circuit input is connected to a high impedance, low energy, signal source and the circuit output must drive a relatively large load. For example, in a memory system a driver circuit must transfer a data signal from a signal source (e.g. the output of a memory cell or of a sense amplifier) having an equivalent impedance of, at most, a few picofarads to a load of 50 or more picofarads within a few nanoseconds.

The devices comprising the output stage of the circuit have to be made relatively large in order to "pass" (sink or source) the relatively large currents necessary to charge and discharge the load capacitance in the time required. However, using devices of large size increases delays within the circuit because of the increased capacitances associated with the devices. This presents a problem because the devices forming the input stage of the circuit are normally made small in order to decrease their input capacitance and insure compatibility with the input signal source. Since the input stage devices are small, they cannot supply the currents needed to quickly charge and discharge the internal nodes of the driver circuit. There, thus exists a problem in the contradictory requirements for: (a) large output devices and small input devices and (b) the need to have the circuit respond extremely quickly.

Still another problem exists, even where large output devices are used, since it takes a considerable amount of time to drive the output of the circuit between the two binary levels.

Accordingly, circuits embodying the invention include means for precharging the circuit output to levels intermediate the high and low levels in anticipation of the application of a data signal which, when applied, causes the output to be driven either to a "high" level or to a "low" level.

Thus, in a circuit in which first and second drive transistors clamp the circuit output to first and second points of operating potential, respectively, in response to a data input signal of one and the other binary value, respectively, there is provided means coupled to the first and second transistors and responsive to a signal presaging the later coming of a data signal for momentarily turning on the first and second drive transistors and presetting the output of the circuit to voltage levels intermediate the first and second points of operating potential.

Circuits embodying the invention may also include a first signal propagation path coupled between the data signal source and the first transistor which propagates the one binary valued signal faster than the other binary valued signal and a second signal propagation path coupled between the data signal source and the second transistor which propagates the other binary signals faster than the one binary signals.

Circuits embodying the invention may also include means for conditioning the first and second signal paths for enabling the quick transfer of data through the circuit without excessive power dissipation.

In the accompanying drawing like reference characters denote like components, and FIG. 1 is a block diagram of portions of a memory system embodying the invention;

FIG. 3 is a diagram of waveforms associated with various points of the circuit of FIG. 2; and FIG. 4 is another embodiment of the driver circuit of the invention.

Figure 1:
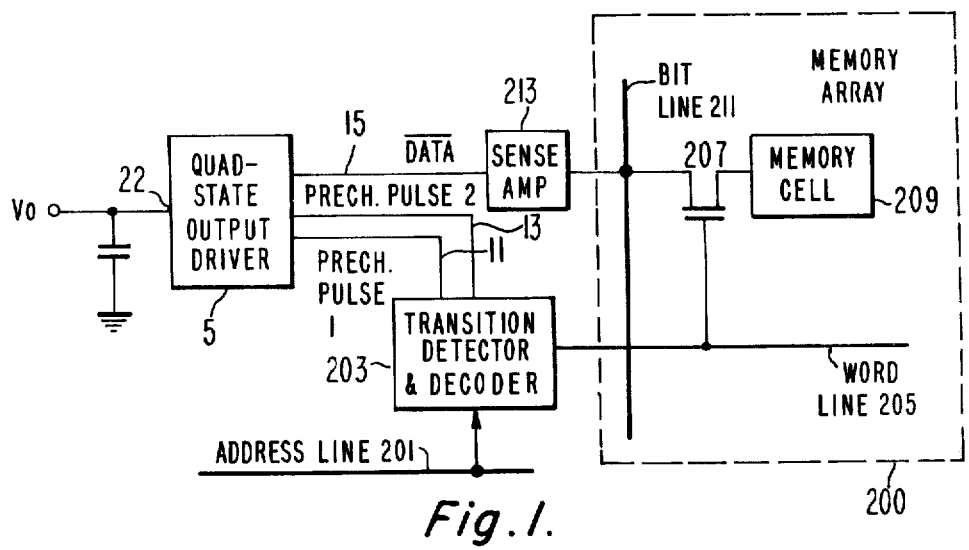

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral, and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude then a given value, which is defined as the threshold voltage ($V_T$) of the transistor. To turn on a P type enhancement IGFET its gate voltage ($V_G$) has to be more negative than its source voltage ($V_S$) by at least $V_T$. To turn on a N-type enhancement IGFET its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{DD}$ or $+V$ volts is arbitrarily defined as a logic "1" or "high" condition.

FIG. 1 shows a portion of a memory system in which an address line 201 is connected to a transition detector and decoder circuit 203. The circuit 203 may take many different forms but for purposes of explaining the subject invention it is sufficient to note that whenever: (a) the memory system is in the READ mode, and (b) a particular memory array (chip) 200 has been selected; then, any change (high-to-low or low-to-high) in the signal on the address line 201 as shown at time $t_0$ in waveform A of FIG. 3 causes the generation of first (PP#1) and second (PP#2) precharge pulses, as shown in waveforms B and C of FIG. 3, respectively, on lines 11 and 13, respectively. PP#1 and PP#2 are generated within 5 to 10 nanoseconds of an address signal transition. PP#1 and PP#2 could be generated simultaneously, but for ease of illustration it is assumed that PP#1 is generated (at time $t_1$) before PP#2 (at time $t_2$). (PP#1 and PP#2 are shown to be generated within block 203, but the circuitry for generating these signals could, instead be part of driver 5.)

Concurrently, with the generation of PP#1 and PP#2, the decoder portion of circuit 203 decodes the address signal change information and generates an enabling signal which is applied to the corresponding word line 205. The word line routes the enabling signal to the gate electrode of a "pass" transistor 207 which causes the contents of a memory cell 209 to be "read-out" onto a bit line 211. A sense amplifier 213 connected to bit line 211 amplifies the signal on line 211 and produces an output signal on line 15 denoted as $\overline{DATA}$. The "new" $\overline{DATA}$ signal generated in response to the address change is assumed to be "valid" (i.e. have the value of the data bit read-out) within 30 to 35 nanoseconds after the occurrence of the address change as shown in waveform D of FIG. 3. That is, 30–35 nanoseconds is the time it takes for the decoder to determine which word line has been selected and for the data selected to then appear on line 15. Precharge pulses PP#1 and PP#2 and the $\overline{DATA}$ signal are applied to the "QUAD-STATE" output driver circuit 5 whose function it is to produce a signal at its output 22 corresponding to $\overline{DATA}$ as quickly as possible (within 20 nanoseconds or less) after $\overline{DATA}$ becomes valid.

Figure 2:
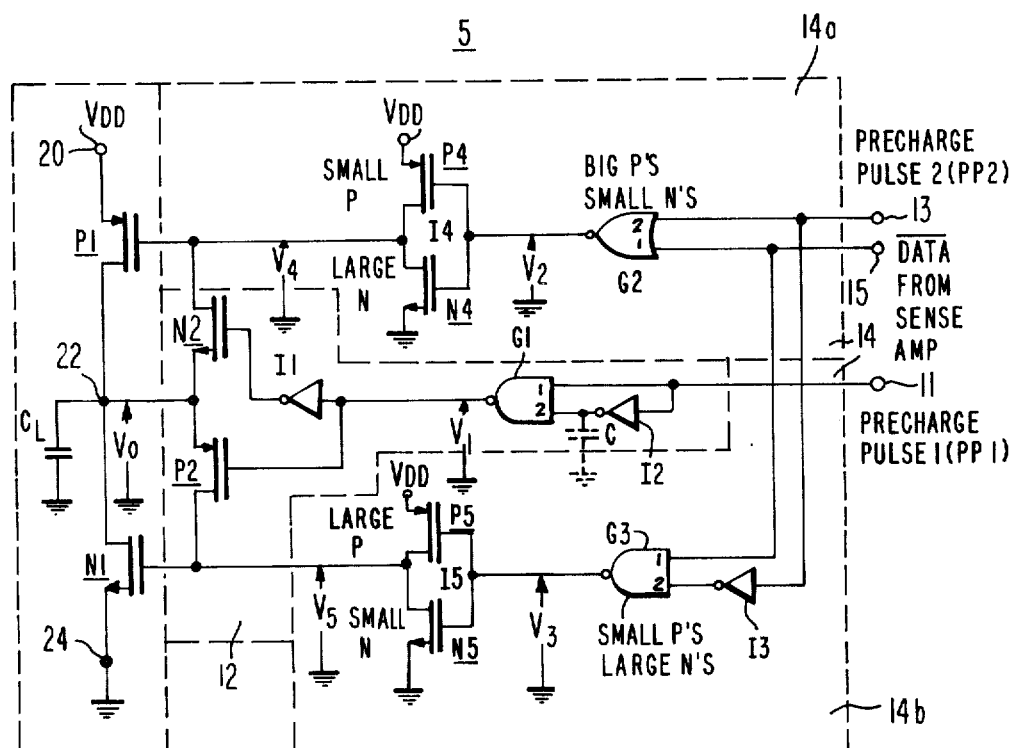
FIG. 2 is a partial schematic partial block diagram of a driver circuit embodying the invention.

The driver 5, detailed in FIG. 2, includes an output stage 10, a look-ahead precharge circuit 12, and a circuit 14 for controlling the precharge level and the flow of data.

Stage 10 includes a "pull-up" transistor P1, conncted at its source to power terminal 20 and at its drain to output terminal 22, and a "pull-down" transistor N1, connected at its drain to terminal 22 and at its source to power terminal 24. Ground or zero volts is applied to terminal 24 and $V_{DD}$ volts, which is positive with respect to ground, is applied to terminal 20. P1 and N1 are large (in size) devices capable of driving a relatively large load, $C_L$, connected to terminal 22 which, by way of example, is assumed to be primarily capacitive and of a value of approximately 50 pf.

Circuit 12 is comprised of transistors P2 and N2, an inverter I1, and a pulse forming network comprised of NAND gate G1 and an inverter I2. The drain-to-source path of N2 is connected between the gate and drain of transistor P1, and the source-to-drain path of P2 is connected between the gate and drain of N1. Inverter I1 is connected at its output to the gate of N2 and at its input together with the gate of P2 to a node (1) to which is applied the output signal (V1) of two-input NAND gate G1. The PP#1 pulse which functions as a look-ahead signal is applied to the one (1) input of G1 and to the input of I2 whose output is applied to the other input (2) of G1. The combination of G1 and I2 functions as a pulse forming network as detailed below.

Inverter I2 is "skewed" in that its switching point is set very close to $V_{CC}$ volts (the "high" level). This is accomplished where I2 is a complementary inverter (similar in structure to I4 or I5 of FIG. 2) by making the P transistor connected between the inverter output and $V_{DD}$ a significantly larger device than the N transistor connected between the inverter output and ground; with both transistors still being relatively small devices. Therefore, I2 responds slowly to positive going input signals and, therefore, its output (from high-to-low) is delayed in response to positive going inputs. Consequently, when PP#1 goes from low-to-high the one (1) input to G1 goes high immediately and the other (2) input to G1 remains high until the output of I2 switches from high to low. Therefore, whenever PP#1 makes a positive going transistion as shown in waveform B of FIG. 2 a negative going pulse is generated at the output of G1 as shown in waveform E.

It will now be shown that whenever the output signal (V1) of G1 goes negative that the output 22 is charged to a predetermined level.

The negative going V1 signal is directly applied to the gate of P2, turning-it-on, and to the input of inverter I1 whose positive going output is then applied to the gate of N2, turning-it-on.

For ease of discussion it is assumed that the impedance ($Z_{N2}$) of the conduction path of N2 is equal to the impedance ($Z_{P2}$) of the conduction path of P2 for like values of $V_{GS}$. N2 and P2 when turned on provide a relatively low impedance path between the gate and drain of P1 and between the gate and drain of N1, respectively, turning-on P1 and N1.

P1 and N1 with their gate electrodes connected via N2 and P2 to output terminal 22 conduct in the common source mode and function to drive the output voltage ($V_0$) towards voltage levels intermediate $V_{DD}$ and zero volts. The level to which the output is charged is a function of the impedances of the conduction paths of P1, N1, P2 and N2 and the state of inverters I4 and I5 which also supply drive to the gate electrodes of P1 and N1.

The exact level to which $V_0$ is charged depends on which condition of three possible conditions applies.

CONDITION 1. P2 and N2 are turned on with transistors N4 and N5 turned on. This condition exists, for example, if the $\overline{DATA}$ signal is "low" and PP#2 is not applied. Since N4 is a much larger device then N5 the gate of transistor P1 will be held very close to zero volts with N2 conducting current from the output into the drain of N4. Meanwhile P2 and N5 function as a voltage divider connected between the output and ground generating at their junction the gate potential of N1. Consequently, the $V_{GS}$ of P1 is significantly greater than the $V_{GS}$ of N1. P1 is turned on harder than N1 and $V_0$ though pulled down from $V_{DD}$ will not be pulled all the way down to $V_{DD}/2$. The output signal for this condition is indicated by a dashed line labelled I in waveform F of FIG. 3.

CONDITION 2. N2 and P2 are turned on with transistors P4 and P5 turned on. This condition exists, for example, if the $\overline{DATA}$ signal is "high" and PP#2 is not applied. Since transistor P5 is much larger than P4 the turn-on potential applied to N1 is greater than the turn-on potential to P1. Consequently, N1 will conduct more heavily than P1. Thus, although the turn on of P1 raises the potential of $V_0$ towards $V_{DD}/2$ it does not bring it all the way up to that level. This condition is indicated by a dashed line labelled II in waveform F of FIG. 3.

CONDITION 3. P2 and N2 are turned on and P4 and N5 are also turned on. This condition exists when PP#2 is present (goes positive). For this signal condition the output is driven towards $V_{DD}/2$, as further discussed below.

Assume the impedance $Z_{P1}$ of the source-to-drain path of P1 to be equal to the impedance $Z_{N1}$ of the source-to-drain path of N1, for equal values of $V_{GS}$. Then, P1 and N1 function to drive the output voltage ($V_0$) at terminal 22 towards $V_{DD}/2$.

The charging towards $V_{DD}/2$ is best explained by taking an extreme example. Thus, assume that $V_0$ is initially at zero volts, and that P2 and N2 are turned-on. Depending upon the various transistor sizes P1 with its source at $V_{DD}$ and its gate connected via N2 to zero volts at $V_0$ is turned-on and pulls the output up (towards $V_{DD}$) until $V_0$ is sufficiently positive to also turn-on N1. With N1 turned-on $V_0$ continues to rise but only towards $V_{DD}/2$, since $Z_{N1}$ and $Z_{P1}$ act more and more like a voltage dividing network. The connection of N2 (and P2) as a source follower also ensures the initial quick turn-on of N2 and P1 with a gradual tapering of conductivity. Initially, with $V_0$ at zero volts, N2 with $V_{DD}$ applied to its gate from I1 is turned on hard while P1 with its gate and source at zero volts is not conducting. However, as $V_0$ rises towards $V_{DD}$, N2 conducts less and P2 conducts more while, in addition, current is supplied by inverters I4 and I5 until an equilibrium condition is reached. Thus, if $V_0$ was at 0 volts prior to the turn-on of P1 and N1 it is pulled up towards $V_{DD}/2$ as shown in waveform F of FIG. 3. On the other hand if $V_0$ was at $V_{DD}$ prior to the turn on of P1 and N1 it is pulled down towards $V_{DD}/2$. The source follower action of N2 and P2 ensures that if a "high" was present prior to the turn-on of P1 and N1 that $V_0$ can be discharged down to a controlled level close to $V_{DD}/2$ (for $Z_{N1}=Z_{P1}$ and $Z_{N2}=Z_{P2}$) while if a "low" was present prior to the turn-on of P1 and N1 that $V_0$ will be charged to a level close to $V_{DD}/2$. (The level to which the output is precharged may be other than near $V_{DD}/2$ depending on the design of P1 and N1. However, for ease of illustration $V_{DD}/2$ is selected as the output logic level transition point).

It is, therefore, evident that every time an address change occurs, a look ahead pulse PP#1 is generated which causes the output of circuit 5 to be precharged towards voltage levels approaching $V_{DD}/2$ prior to the arrival of a "new" data signal. This results in faster response for propagating $\overline{DATA}$ signals through the output circuitry.

Although precharging the output to levels near $V_{DD}/2$ usually provides fast response to a data level charge, it is not necessary to approach this level closely to achieve benefits from this invention. Firstly, if the data does not change, then it is advantageous that the output does not approach the "indeterminate" $V_{DD}/2$ level too closely, but remains at a suitable voltage margin removed from $V_{DD}/2$. Secondly, dynamic power consumption is reduced for those cases where the output voltage does not change or the off device is not turned on so strongly. Finally, the timing of the precharge pulse PP#1 is rendered less critical if the on-impedance of precharged N2 and P2 is such that a data change signal can still propagate through inverters I4 and I5 to change the output level even though precharge pulse PP#1 is still keeping N2 and P2 on. A net speed advantage occurs as long as the output level is charged by the look ahead precharge pulse PP#1 toward an intermediate level, even in the absence of the second precharge pulse PP#2.

Circuit 14 includes a first signal control path 14a for supplying a signal derived from lines 13 and 15 to the control electrode of P1 and a second signal control path 14b for supplying a signal derived from lines 13 and 15 to the control electrode of N1. Path 14a includes a two input NOR gate G2 whose output signal V2 is applied to the input of an inverter I4 whose output signal (V4) is applied to the gate electrode of P1. Path 14b comprises inverter I3 whose output signal (V13) is applied to one input of two input NAND gate G3 whose output signal (V3) is applied to the input of an inverter I5 whose output signal (V5) is applied to the gate electrode of N1.

The $\overline{DATA}$ signal is applied to the one (1) inputs of G2 and G3, while PP#2 present on line 13 is applied to the second (2) input of G2 and to the input of I3.

Signal path 14a is preferably designed to ensure that a signal tending to turn-on transistor P1 is propagated very quickly via G2 and I4 at the expense of allowing a signal tending to turn-off transistor P1 is to be propagated more slowly. Similarly, signal path 14b is preferably designed to ensure that a signal tending to turn-on N1 is propagated very quickly via G3 and I5 while a signal tending to turn-off N1 is propagated more slowly.

This is accomplished by offsetting (or "skewing") the switching point of G2, G3, I4 and I5.

Inverters I4 and I5 are complementary inverters; each inverter comprising an IGFET of P-conductivity type having it conduction path connected in series with the conduction path of an IGFET of N-conductivity type between $V_{DD}$ and ground. The gate electrodes of the two IGFETs are connected in common to the inverter input and the drain electrodes of the two IGFETs are connected in common to the inverter output.

The shape of the transfer curve and hence the switching point of a complementary inverter is dependent (among others) on the characteristics and impedances of the N and P transistors forming the inverters. The impedance (Z) of each transistor is in turn a function of the ratio of its channel length (L) of its channel width (W), $[Z=f(L/W)]$. The switching point of the inverters may then be controlled by proper selection and design of the width to length (W/L) ratios of the IGFETs forming the inverters; [This assumes that the other IGFET parameters, (e.g. the threshold voltages, oxide thickness, doping levels), are the same.]

By making P4 smaller than N4 the switching (or "Trip") point of I4 is set close to ground (but above the $V_T$ of N4). Thus, a positive going signal at the input of I4 causes V4 to go "low" quickly while a negative going signal (from $V_{DD}$ to ground) having the same slope will take relatively longer to reach the switching point. Also, once the switching point is reached it takes longer for P4 since it is a small device (i.e. high impedance) to charge the capacitance at its output than it takes N4 (a much larger device) to discharge that capacitance to ground. Hence, V4 will rise towards the "high" level relatively slowly (in comparison to the faster falling "low" going level).

With respect to I5, P5 preferably is made larger than N5. This sets the switching point of I5 closer to $V_{DD}$ so that V5 goes "high" quickly and "low" slowly in an analogous manner to that described for I4.

As to G2 and G3: G2 is assumed to be a two-input complementary NOR gate comprised of two P transistors connected in series between $V_{DD}$ and the gate output and two N-transistors connected in parallel between the gate output and ground. The P transistors of G2, as indicated in FIG. 2, are larger than its N transistors. Hence, the switching point of G2 is set close to $V_{DD}$, so that its output V2 goes "high" quickly and "low" slowly.

G3 is assumed to be a two-input complementary NAND gate comprised of two P transistors connected in parallel between $V_{DD}$ and the gate output, and two N transistors connected in series between the gate output and ground. The N transistors of G3 are, as indicated in FIG. 2, larger than its P transistors. Hence, the switching point of G3 is set close to ground potential so that its output V3 goes "low" quickly and "high" slowly.

Because of the skewed signal propagation paths through blocks 14a and 14b of FIG. 2, it is possible to apply a second precharge pulse PP#2 to improve the "slow" direction of signal propagation and further improve output response for data changes. This approach is most effective when the timing of new data arrival is known with accuracy, as in a latched data transfer system. Alternately, the circuitry of FIG. 4 (based on the application of precharge pulse PP#1 to stages I4 and I5) provides an advantageous approach when PP#1 overlaps the data pulse and yet allows data to propagate through even when PP#1 is on and tends to hold the input and outputs of I4 and I5 at an intermediate level. The operation of this PP#2 speedup circuit will now be explained assuming that PP#2 makes a positive going transition (at time $t_2$) shortly after PP#1 (at time $t_1$) has made a positive going excursion as shown in waveforms C and B, respectively of FIG. 3.

Recall that after PP#1 went high, V1 went low, N2 and P2 were (and remain) turned on, and N1 and P1 were also turned on driving $V_0$ towards suitable intermediate voltage levels nearer $V_{DD}/2$.

When PP#2 goes positive the output of NOR gate G2 is driven towards the low level, as shown in waveform G for time $t_2$-to-$t_3$, and the output of I4 is driven towards the high level. However, as discussed above, P4 is turned on slowly and V4 rises toward $V_{DD}$ slowly (see waveform I after time $t_3$). This ensures that P1 will be able to raise $V_0$ towards $V_{DD}/2$ before the effect of P4 is felt.

Concurrently, (with PP#2 going positive) the output of I3 goes low causing V3 to rise slowly towards, as shown in waveform H for time $t_2$-to-$t_3$, and, as discussed above, N5 is being turned-on slowly. This ensures that N1 will be able to lower $V_0$ towards $V_{DD}/2$ before the effect of N5 is felt.

The turn-on of P4 causes V4 and hence the voltage ($V_{GP1}$) at the gate of P1 to increase above $V_{DD}/2$ while the turn-on of N5 cause V5 and hence the voltage ($V_{GN1}$) at the gate of N1 to decrease below $V_{DD}/2$. Hence, the conduction through P1 and N1 is being decreased. However, note that P1 and N1 have already charged $V_0$ to, or close to, $V_{DD}/2$. Furthermore, although the turn-on of P4 and N5 decreases the conductivity of P1 and N1, the drive of $V_0$ towards $V_{DD}/2$ is maintained.

With P4 and N5 turned-on there is formed a conduction path between $V_{DD}$ and ground via the conduction paths of P4, N2, P2 and N5. The conduction path of P4 presents an impedance between $V_{DD}$ and the gate of P1. The conduction path of N2 provides an impedance between the gate of P1 and the output 22. The conduction path of P2 provides an impedance between the output 22 and the gate of N1, and the conduction path of N5 provides an impedance between the gate of N1 and ground.

Assume that the relative sizes of P4, N5, P2 and N2 are such that when all four are turned-on the impedance ($Z_{P4}$) of the conduction of P4 is approximately equal to the impedance ($Z_{N5}$) of the conduction path of N5 and that these impedances are considerably greater than $Z_{N2}$ which is approximately equal to $Z_{P2}$.

Since $Z_{P4}$ and $Z_{N5}$ are relatively high impedances the conduction path comprising P4, N2, P2 and N5 forms a high impedance, low power dissipation, path. Since the impedance of $Z_{P4}$ plus $Z_{N2}$ is approximately equal to $Z_{P2}$ plus $Z_{N5}$, $V_0$ continues to be driven towards, or held at, $V_{DD}/2$. Furthermore, by simple divider action while $V_0$ is going towards $V_{DD}/2$, V4 which is the voltage ($V_{GP1}$) applied to the gate of P1 will be driven (or held) somewhat above $V_{DD}/2$, and the voltage V5 which is the voltage ($V_{GN1}$) applied to the gate of N1 will be driven, or held, somewhat, below $V_{DD}/2$, as shown after time $t_3$ in waveforms F, I and J of FIG. 3.

Consequently, in response to PP#1 going high at time $t_1$, P1 and N1 are turned-on and quickly drive $V_0$ toward $V_{DD}/2$. Then, in response to PP#2 going high at time $t_2$, I4 and I5 are driven in a direction to decrease the conduction levels in P1 and N1 while at the same time ensuring that $V_0$ continues moving towards $V_{DD}/2$ and with the gates of P1 and N1 held at potentials close to $V_{DD}/2$.

By decreasing the conductivity of P1 and N1 it is easier, when the data signal is applied, to turn-off the unselected device. In a like manner by holding the potential at $V_{GP1}$ slightly above $V_{DD}/2$ it is easier to turn-it-off or to turn-it-on quickly. Likewise, by holding $V_{GN1}$ slightly below $V_{DD}/2$ it is easier to turn-it-off or to turn-it-on quickly.

The operation of the circuit for the condition when $\overline{\text{DATA}}$ becomes "valid" (at time $t_4$) is now examined.

Assume that as $\overline{\text{DATA}}$ becomes valid and goes "high" that V1 goes (or has just gone) high and PP#2 goes (or has just gone) low. When V1 goes high P2 and N2 are turned off. Due to nodal capacitances just before $\overline{\text{DATA}}$ goes high the voltages at the various modes remain as discussed above and as shown in FIG. 3 for time $t_4$.

$\overline{\text{DATA}}$ high causes the output of G3, which is skewed to respond quickly to positive going signals, to go low very fast. I5 which is skewed to respond quickly to negative going signals switches very fast with P5 turning-on hard and driving $V_{GN1}$ which was slightly below $V_{DD}/2$ towards $V_{DD}$. Concurrently, P1 is being turned off since $V_{GP1}$ is being driven towards $V_{DD}$ by P4. Thus, N1 which is being turned-on hard can quickly discharge terminal 22 to ground.

With $\overline{\text{DATA}}$ high the output of G2 remains low (as when PP#2 was present) and the output of I4 remains high. Note that there is no delay due to the need for any element to switch. With N2 turned-off, P4 continues to charge the gate of P1 (which was slightly above $V_{DD}/2$) towards $V_{DD}$, quickly turning-it-off.

Thus, N1, P2 and P1, N2 which had precharged the output 22, P4 and N5 which had precharged the gates of P1 and N1, and the "skewed" or "ratioed" paths enable the data signal to propagate very quickly through the circuit and to quickly produce a stable output signal. The speed with which $V_0$ is driven to the stable condition in comparison to conventional circuitry, which does not precharge the output, and/or internal nodes of the circuit, and/or include skewed signal propagation paths, is shown in waveform F.

The operation on the circuit if the new $\overline{\text{DATA}}$ was low is the mirror or complement to that just described. $\overline{\text{DATA}}$ low with PP#2 low causes V2 to go high and V4 to go low. Since G2 and I4 are skewed to respond quickly to these signals and since $V_{GP1}$ and $V_0$ are charged to the levels described above, P1 is turned-on very quickly and drives $V_0$ to $V_{DD}$ volts. Concurrently, with $\overline{\text{DATA}}$ low, the output of V3 remains high and with P2 turned-off N5 quickly and easily pulls the gate of N1 to ground turning N1 off quickly and enabling P1 to pull $V_0$ to $V_{DD}$ without dissipating unnecessary power.

It should be evident that in the steady state condition when PP#2 is low and when V1 is low, the value of the $\overline{\text{DATA}}$ signal on line 15 determines whether P1 or N1 is turned on. This defines two binary output states of the circuit 5.

When PP#2 is high, or whenever a positive signal is applied to line 13, and V1 is low, P1 and N1 are turned-off regardless of the value of the signal on line 15. This defines a third (tri-state) condition when the output is virtually "floating"—since it is not tightly coupled to any point of potential and can assume practically any value between 0 and $V_{DD}$ volts.

Finally, whenever there is a low-to-high transition on line 11, P2 and N2 are turned-on and the output 22 is charged intermediate $V_{DD}$ and zero (whether PP#2 is high or low). This defines a fourth ("QUAD-STATE") condition at the output. Thus, the look ahead precharge circuit 12 may be viewed as a circuit for momentarily turning-on both the pull-up (P1) and the pull-down (N1) transistors of a tri-state circuit for presetting the output of the tri-state to a voltage level intermediate the high and low voltages to which the output is driven when a data signal is present.

The circuit of FIG. 2 as shown or modified in FIG. 4 may be operated such that the output is charged close to the midpoint. This is a preferred mode of operating the circuit when it is known exactly when the $\overline{\text{DATA}}$ signal is applied to the circuit with respect to the generation of the precharge pulses.

However, when the exact time of application of the $\overline{\text{DATA}}$ signal is not known it may be preferrable to operate without a PP#2 pulse or with a very short PP#2 pulse. The PP#1 pulse would still cause some precharge of the output and of the gate potentials of P1 and N1. Although the extent of precharge would not be equal to the case when PP#2 is present, the benefits of the invention would still exist. A significant factor in the extent to which the output and the gates of P1 and N1 would be charged then depends on the ratio of the impedances of N2 and P2 to each other and to the impedances of the transistors in I4 and I5. These, of course, could be varied to set the range of precharge levels desired.

The circuit of FIG. 2 may be modified as shown in FIG. 4. The conduction path of a transistor P41 is connected between the input and output of I4 and the conduction path of a transistor N51 is connected between the input and output of inverter I5. The gate electrode of P41 is connected to the output of G1 and the gate electrode of N51 is connected to the output of I1. Consequently, whenever V1 goes low P41 and N51 are turned on and inverters I4 and I5 are driven towards their toggle or switching point, so that their response to the $\overline{\text{DATA}}$ signal coming after the conditioning of the circuit is extremely fast.

What is claimed is:

1. The combination comprising:
   first and second power terminals for the application thereto of first and second voltages, respectively;
   an output point;
   first and second transistors, each transistor having a conduction path and a control electrode,
   means connecting the conduction path of said first transistor between said first power terminal and said output point;
   means connecting the conduction path of said second transistor between said output point and said second power terminal;
   a first means coupled to the control electrodes of said first and second transistors for, selectively, turning either one of them on and the other one off and for, selectively, turning them both off; and
   second means coupled to the control electrodes of said first and second transistors for, selectively, turning them both on and charging said output point to a level intermediate the voltages applied to said first and second power terminals.

2. The combination as claimed in claim 1, wherein said first means includes a signal input port, and also includes a first signal propagation path coupled between said signal input port and the control electrode of said first transistor and a second signal propagation path coupled between said signal input port and the control electrode of said second transistor; and
   wherein said second means includes third and fourth transistors, each transistor having first and second electrodes defining the ends of its conduction path and a control electrode;
   wherein the conduction path of said third transistor is connected between the control electrode of said first transistor and said output point; and
   wherein the conduction path of said fourth transistor is connected between the control electrode of said second transistor and said output point.

3. The combination as claimed in claim 2 wherein said second means includes a signal input terminal, and a pulse forming network having an input connected to said signal input terminal and having an output coupled to the control electrodes of said third and fourth transistors for either turning them both on or both off.

4. The combination as claimed in claim 2 wherein said first signal propagation path includes a first inverter connected at its output to the control electrode of said first transistor,
   wherein said second signal propagation path includes a second inverter connected at its output to the control electrode of said second transistor; and
   wherein the switching point of said first and second inverters is offset in a direction to enable the quick turn-on of said first and second transistors and the relatively slow turn off of these transistors, in response to signals applied to the input of said first and second inverters.

5. The combination as claimed in claim 4 wherein said first and fourth transistors are of one conductivity type and said second and third transistors are of opposite conductivity type to said one conductivity type;
   wherein said first and second inverters are complementary inverters, each being comprised of one transistor of said one conductivity type and another transistor of said opposite conductivity type;
   wherein the one transistor of said first inverter is smaller than, and of significantly greater impedance than, said other transistor of said first inverter; and wherein the one transistor of said second inverter is larger than, and of significantly lower impedance than, said another transistor of said second inverter.

6. The combination as claimed in claim 5 wherein said input point is adapted to receive a data signal and a first control signal;

wherein said first signal path includes a first logic gate for coupling the signals at said input port to the input of said first inverter; and wherein said second signal path includes a second logic gate for coupling the signals at said input port to the input of said second inverter.

7. In a circuit to which is applied binary valued data input signals and in which the conduction path of a first pull-up transistor is connected between a first voltage terminal and an output point and in which the conduction path of a second pull-down transistor is connected between the output and a second voltage terminal, one of said first and second transistors being turned-on and the other one turned-off for one value of input signal and said one of said first and second transistors being turned-off and the other one turned-on for the other value of input signal, and said circuit being of the type to which is applied a second signal indicative that a new data signal is about to be applied to the circuit, the improvement comprising:

normally non-conductive means connected to the control electrodes of said first and second transistors responsive to said second signal for momentarily turning-on both said first and second transistors and charging said output point to a voltage having a value intermediate the voltages applied to said first and second voltage terminals.

8. In a memory system in which a binary valued data signal is to be propagated via a circuit to which is applied first and second control signals prior to the application of the data signal to be propagated, said circuit comprising:

first and second power terminals for the application thereto of first and second voltages, respectively;

an output point;

first and second transistors, each transistor having a conduction path and a control electrode, means connecting the conduction path of said first transistor between said first power terminal and said output point;

means connecting the conduction path of said second transistor between said output point and said second power terminal;

first means, responsive to said data input signal and to said first control signal, coupled to the control electrodes of said first and second transistors for, in the absence of said first control signal, turning one of them on and the other one off for one binary value of input signal and turning said one of them off and said other one on for the other value of input signal, and for, in the presence of said first control signal, normally turning off both said first and second transistors; and second means responsive to said second control signal coupled to the control electrodes of said first and second transistors for momentarily turning them both on and charging said output point to a level intermediate the voltages applied to said first and second power terminals prior to the application of a data signal to either one of the control electrodes of said first and second transistors.

9. The combination as claimed in claim 8 wherein said second means includes third and fourth transistors; each transistor having a conduction path and a control electrode;

wherein the conduction path of said third transistor is connected between the control electrode of said first transistor and said output point;

wherein the conduction path of said fourth transistor is connected between the control electrode of said second transistor and said output point; and wherein said second means further includes a pulse forming network responsive to said second signal for turning-on both of said third and fourth transistors in response to a given condition of said second control signal.

10. The combination as claimed in claim 9:

wherein said first, second, third and fourth transistors are insulated-gate field-effect transistors (IGFETs);

wherein said first and fourth transistors are of one conductivity type;

wherein said second and third transistors are of opposite conductivity type to said one conductivity type; and wherein said third and fourth transistors when turned-on conduct in the follower mode.

11. The combination as claimed in claim 8 wherein said first means includes a first signal propagation path coupled between said control electrode of said first transistor and an input port to which is applied said data input and said first control signal, and a second signal propagation path coupled between said control electrode of said second transistor and said input port; and wherein each one of said first and second paths propagates faster a signal tending to turn-on its associated transistor than a signal tending to turn-off its associated transistor.

12. The combination comprising:

first and second power terminals for the application thereto of first and second voltages, respectively;

an output point;

first and second transistors, each transistor having a conduction path and a control electrode;

means connecting the conduction path of said first transistor between said first power terminal and said output point;

means connecting the conduction path of said second transistor between said output point and said second power terminal;

means, coupled to the control electrodes of said first and second transistors for, selectively, turning either one of them on and the other one off; for, selectively, turning them both off; and for, selectively, turning them both on and charging said output point to a level intermediate the voltages applied to said first and second power terminals.

13. The combination as claimed in claim 12 wherein said means includes a first means which includes a signal input port and also includes a first signal propagation path coupled between said signal input port and the control electrode of said first transistor and a second signal propagation path coupled between said signal input port and the control electrode of said second transistor; and wherein said means also includes a second means which includes a first selectively enabled conduction path means connected between the control electrode of said first transistor and said output point; and a second selectively enabled conduction path means connected between the control electrode of said second transistor and said output point.

* * * * *